United States Patent
Nogami et al.

(10) Patent No.: US 6,281,587 B1
(45) Date of Patent: Aug. 28, 2001

(54) MULTI-LAYERED COAXIAL INTERCONNECT STRUCTURE

(75) Inventors: Takeshi Nogami, Sunnyvale; Sergey Lopatin, Santa Clara; Shekhar Pramanick, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/522,148

(22) Filed: Mar. 9, 2000

Related U.S. Application Data (62) Division of application No. 09/131,919, filed on Aug. 10, 1998, now Pat. No. 6,060,383.

(51) Int. Cl.[7] .......................... H01L 23/48; H01L 23/52; H01L 23/40; H01L 21/4763
(52) U.S. Cl. .......................... 257/758; 257/759; 257/760; 257/761; 438/622
(58) Field of Search .................. 257/758, 759, 257/760, 761; 438/622

(56) References Cited

U.S. PATENT DOCUMENTS

| | | |
|---|---|---|
| 5,436,412 | 7/1995 | Ahmad et al. . |
| 5,468,685 | 11/1995 | Orisaka et al. . |
| 5,514,908 * | 5/1996 | Liao et al. .......................... 257/751 |
| 5,656,543 | 8/1997 | Chung . |
| 5,666,007 | 9/1997 | Chung . |
| 5,682,062 | 10/1997 | Gaul . |
| 5,691,280 | 11/1997 | Eckstein et al. . |
| 5,691,572 | 11/1997 | Chung . |
| 5,712,768 | 1/1998 | Werther . |
| 5,883,433 * | 3/1999 | Oda .......................... 257/750 |
| 6,027,995 * | 2/2000 | Chiang et al. .......................... 438/623 |
| 6,037,664 * | 3/2000 | Zhao et al. .......................... 257/758 |
| 6,147,402 * | 11/2000 | Joshi et al. .......................... 257/751 |

* cited by examiner

*Primary Examiner*—Olik Chaudhuri
*Assistant Examiner*—Shrinivas H. Rao
(74) *Attorney, Agent, or Firm*—Amin & Turocy, LLP (57) ABSTRACT

A method of forming a multi-layered interconnect structure is provided. A first conductive pattern is formed over an insulation layer. A first dielectric material is deposited over the first conductive pattern, and plugs are formed in the first dielectric material. A second conductive pattern is formed over the first dielectric material and plugs so as to form the multi-layered interconnect structure in part. Then, the first dielectric material is stripped away to leave the multi-layered interconnect structure exposed to air. A thin layer of second dielectric material is deposited so as to coat at least a portion of the interconnect structure. Next, a thin layer of metal is deposited so as to coat the at least a portion of the interconnect structure coated with the thin layer of second dielectric material. A third dielectric material is deposited over the interconnect structure to replace the stripped away first dielectric material.

15 Claims, 11 Drawing Sheets

MULTI-LAYERED COAXIAL INTERCONNECT STRUCTURE

This application is a divisional patent application of U.S. patent application Ser. No. 09/131,919, filed Aug. 10, 1998 now U.S. Pat. No. 6,060,383, entitled Method for making multilayered coaxial interconnect structure.

TECHNICAL FIELD

The present invention generally relates to a multi-layered coaxial interconnect structure and method for making the same.

BACKGROUND OF THE INVENTION

There is an increasing demand for miniaturization in the integrated circuits industry. This demand has led to an ever constant reduction in separation between conductive lines (e.g., metal lines) in order to reduce integrated circuit size and/or increase density. The reduced spacing between the conductive lines has the undesirable effect of increasing the capacitance of whatever material lies between the conductive lines. This phenomenon is known as capacitive crosstalk.

In the past, overall integrated circuit (IC) performance depended primarily on device properties, however, this is no longer the case. Parasitic resistance, capacitance and inductance associated with interconnections and contacts of an IC are beginning to become increasingly significant factors in IC performance. In current IC technology, the speed limiting factor is no longer device delay, but the resistive-capacitive (RC) delays associated with the conductive interconnections (e.g., metal lines) of the IC.

Conventional ICs typically employ an interconnect structure wherein a first conductive line is adjacent a second conductive line. If the crosstalk or capacitance between the first conductive line and the second conductive line is high, then the voltage on the first conductive line alters or affects the voltage on the second conductive line. This alteration in voltage may result in the IC being inoperable as a result of misinterpreting logic zeros, logic ones and voltage levels, and consequently incorrectly processing binary and/or analog information In order to reduce capacitive coupling and therefore reduce capacitive crosstalk, low dielectric constant (low-K) materials have been developed to replace conventional dielectric/insulation materials that lie between conductive lines in order to insulate one conductive line from the other. Conventional insulation materials such as silicon dioxide exhibit a dielectric constant of about 4.0. Newer materials with lower dielectric constants have been developed. For example, polyimides generally exhibit a dielectric constant of about 2.4 to about 3.0; Teflon exhibits a dielectric constant of about 1.6 to 2.2; and acrogels typically exhibit a dielectric constant of about 2. However, the use of many low-K dielectric/insulation materials is not practicable because equipment is not available to properly process the new dielectric/insulation materials in various ICs. Furthermore, the chemical or physical properties of many low-K dielectric/insulation materials are usually difficult to make compatible or integrate into conventional IC processing. For example, as multiple layers of interconnects are formed, many low dielectric constant materials used to insulate conductive lines exhibit cracking.

Figures 1, 2:
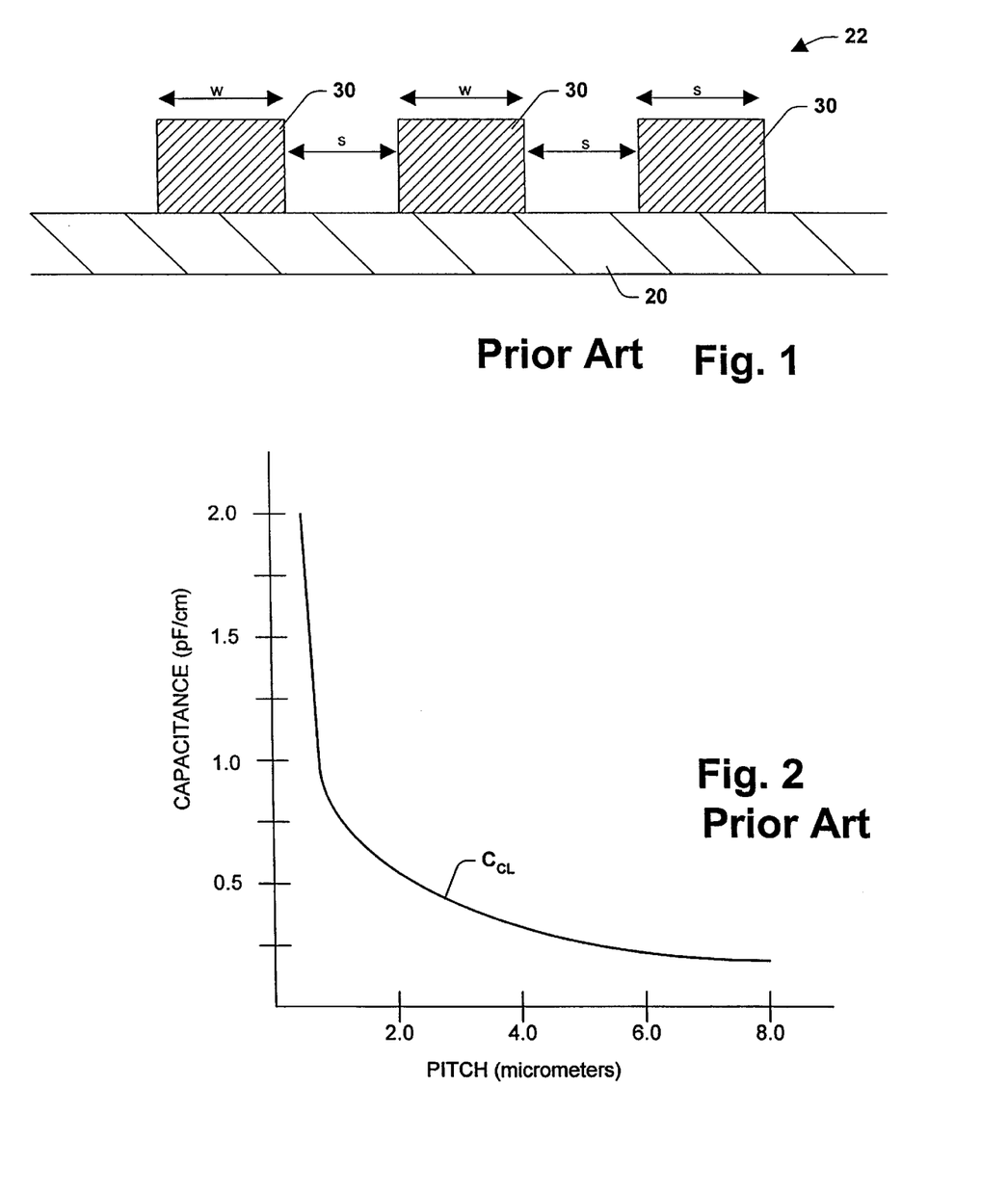
FIG. 1 is a schematic cross-sectional illustration of a portion of a prior art semiconductor device including a conductive pattern.
FIG. 2 is a graphical illustration of a relationship between conductive line pitch and capacitive coupling.

FIGS. 1 and 2 illustrate the relationship between closely spaced conductive lines and capacitive coupling. Conductive lines 30 are adjacent each other and provide necessary electrical connections between devices of an integrated circuit (not shown). Although only three conductive lines 30 are shown for ease of understanding, it is to be appreciated that many thousands or even millions more such conductive lines may exist in the integrated circuit. As noted above, the increasing demand for miniaturization in the integrated circuits industry has led to an ever constant reduction in separation between the conductive lines 30 in order to reduce integrated circuit size. However, the reduced spacing between the conductive lines 30 has the undesirable effect of increasing the capacitance of whatever material lies between the conductive lines 30 to result in capacitive crosstalk between adjacent conductive lines.

A quantity known as pitch (pitch=w+s) is often employed to characterize conductive capacitance crosstalk for adjacent conductive lines used in the integrated circuit industry, where "w" is the cross-sectional width of a conductive line and "s" is the distance of separation between adjacent conductive lines. FIG. 2 graphically illustrates the capacitance between the conductive lines 30 as a function of physical separation. A reduction in pitch is an ongoing activity in the integrated circuit industry in order to optimize substrate surface area utilization in integrated circuits. The capacitance between the conductive lines 30 labeled $C_{CL}$ in FIG. 2 is shown to increase exponentially as pitch is reduced or as the conductive lines 30 are brought closer together. The increase in capacitive coupling resulting from the conductive lines 30 being brought closer together contributes to capacitive crosstalk between the adjacent conductive lines 30, respectively.

Since market forces are driving the integrated circuitry towards bringing the conductive lines 30 closer together in order to maximize substrate surface utilization, insulation having low dielectric constant is required between the conductive lines 30 in order isolate the conductive lines 30 from one another and to lower capacitive coupling between the conductive lines 30, respectively, and in turn reduce capacitive crosstalk.

Conventional semiconductors such as for example those fabricated according to the aforementioned method do not provide for sufficient insulation between the conductive lines 30 suitable for overcoming capacitive crosstalk between closely spaced conductive lines, particularly at higher frequencies approaching the gigahertz range.

In view of the above, it would be desirable to have a semiconductor fabrication method which provides for an insulation material between conductive lines having a dielectric constant suitable for attaining higher IC control speed and meet increasing substrate surface utilization requirements. Furthermore, it would be desirable for such a method to also provide for formation of a coaxial interconnect structure so as to further enhance IC functionality.

SUMMARY OF THE INVENTION

The present invention provides for a multi-layered interconnect structure which employs dielectric material having a dielectric constant suitable for overcoming capacitive cross-talk between conductive lines. Furthermore, at least some of the conductive lines of the multi-layered interconnect structure are coaxial in nature, wherein the coaxial conductive lines include a central conductive portion which is surrounded by a thin dielectric material and the thin dielectric material surrounded by a metal conductor. Thus, a coaxial conductive line of the present invention provides for a metal conductor circumferentially surrounding a signal carrying central conductor with an insulating material interposed there between. The central conductor is thus substantially shielded from passing noise and induced electromagnetic fields resulting from changing signals therein as well as the central conductor being substantially shielded from externally generated noise and electromagnetic fields.

In making the multi-layered interconnect structure of the present invention, metal lines are formed on a substrate. Then a first dielectric material (e.g., $SiO_2$) is deposited on the metal lines, and vias are formed in the first dielectric material thereafter. Then plugs are formed in the vias and subsequent interconnect layers are formed over this first interconnect layer accordingly. Once the base multi-level interconnect structure is formed, the first dielectric material is stripped leaving the multi-level interconnect structure (e.g., conductive lines and plugs) exposed to air. Then a first deposition step is performed to form a thin coat of second dielectric material on the multi-level interconnect structure. A second deposition step is performed thereafter to form a thin coat of metal over the coat of dielectric material so as to make those portions of the multi-layered interconnect structure exposed to the ALD steps coaxial in nature. Next, a third dielectric material (having a dielectric constant suitable for mitigating capacitive cross-talk between adjacent conductive lines) is deposited on the interconnect structure to replace the first dielectric material which was stripped away.

The resulting multi-layered interconnect structure may exhibit superior performance as compared to those fabricated in accordance with conventional techniques. In particular, the present invention provides for employing a dielectric material of desirably low dielectric constant which could not be employed in conventional IC fabrication processes without exhibiting cracking. Furthermore, the present invention provides for at least some of the conductive lines and plugs of the multi-level interconnect structure to be coaxial in nature which affords for an increased scope of functionality as compared to conventionally fabricated multi-layered interconnect structures.

In accordance with one particular aspect of the invention, a method of forming a multi-layered interconnect structure includes the steps of: forming a first conductive pattern over an insulation layer; depositing a first dielectric material over the first conductive pattern; and forming plugs in the first dielectric material. The method further includes the steps of forming a second conductive pattern over the first dielectric material and plugs so as to form a multi-layered interconnect structure; stripping the first dielectric material; and depositing a second dielectric material over the interconnect structure to replace the stripped away first dielectric material.

Another aspect of the present invention relates to a method of forming an interconnect structure having at least a coaxial portion including the steps of: forming a first conductive pattern over an insulation layer; depositing a first dielectric material over the first conductive pattern; and forming plugs in the first dielectric material. The method also includes the steps of: forming a second conductive pattern over the first dielectric material and plugs so as to form the interconnect structure; stripping the first dielectric material; depositing a thin layer of second dielectric material so as to coat at least a portion of the interconnect structure; and depositing a thin layer of metal so as to coat the at least a portion of the interconnect structure coated with the thin layer of second dielectric material.

Yet another aspect of the present invention relates to a semiconductor device including: a substrate; and an insulating layer formed on the substrate. The semiconductor device further includes an interconnect structure which comprises: a first conductive pattern formed on the insulating layer, the conductive pattern including at least two conductive lines adjacent one another; a first dielectric material formed over the conductive pattern, the first dielectric material filling a space between the at least two conductive lines; at least one plug formed in the first dielectric material; and a second conductive pattern formed over the first dielectric material and the at least one plug. At least a portion of the interconnect structure is coaxial in nature.

Still another aspect of the present invention relates to a method of forming an interconnect structure having at least a coaxial portion, including the steps of: forming a first conductive pattern over an insulation layer; depositing a first dielectric material over the first conductive pattern; and forming plugs in the first dielectric material. The method also includes the steps of forming a second conductive pattern over the first dielectric material and plugs so as to substantially form the interconnect structure; stripping the first dielectric material; depositing a thin layer of second dielectric material so as to coat at least a portion of the interconnect structure; depositing a thin layer of metal so as to coat the at least a portion of the interconnect structure coated with the thin layer of second dielectric material; and depositing a third dielectric material over the interconnect structure to replace the stripped away first dielectric material.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The method of the present invention will be described with reference to the formation of a multi-layered interconnect structure having at least a coaxial portion, and utilizing a dielectric material having a dielectric constant suitable for mitigating capacitive coupling between closely spaced conductive lines of the multi-layered interconnect structure. The following detailed description is of the best modes presently contemplated by the inventors for practicing the invention. It should be understood that the description of these preferred embodiments are merely illustrative and that they should not be taken in a limiting sense.

Figure 3A:
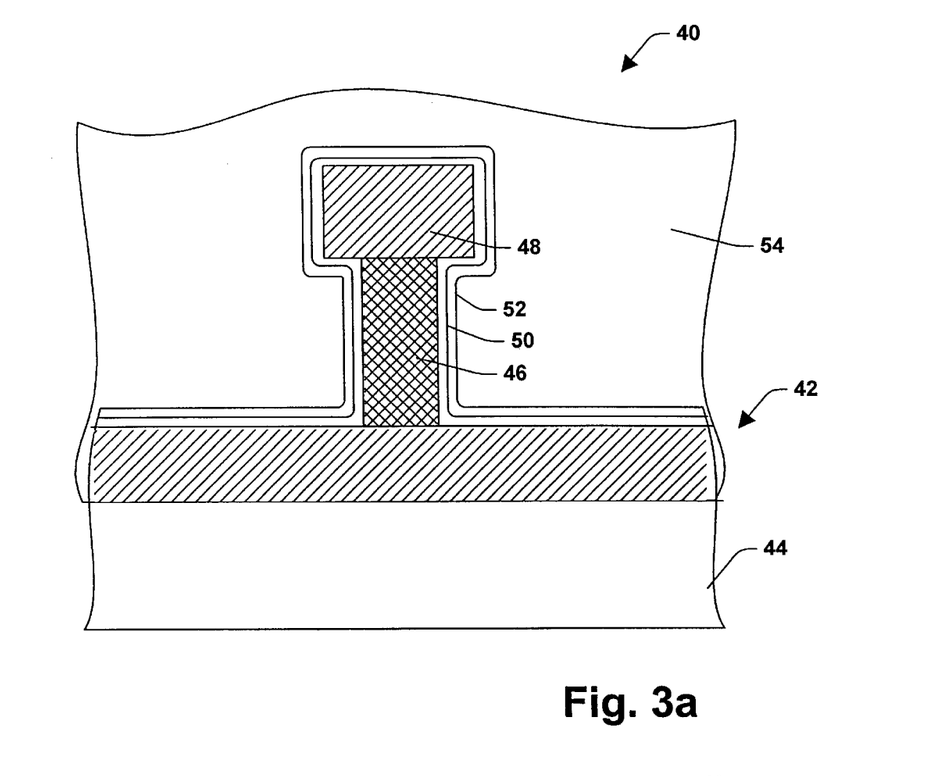
FIG. 3a is a partial schematic cross-sectional illustration of a multi-layered interconnect structure in accordance with the present invention.

Referring initially to FIG. 3a, a partial cross-sectional illustration is shown of a multi-layered interconnect stricture 40 in accordance with the present invention. The multi-layered interconnect structure 40 includes a first conductive line 42 formed on an insulated substrate 44. The first conductive line 42 is part of a first conductive pattern 43 (FIG. 3c) which lies atop the insulated substrate 44. The structure 40 includes a plug 46 for providing electrical connection between the first conductive line 42 and a second conductive line 48 (which is part of a second conductive pattern 45 (FIG. 8)). At least a portion of the multi-layered interconnect structure 40 is coaxial in nature. As shown, the second conductive line 46 and the plug 46 are circumferentially surrounded by a thin insulating dielectric material 50. Circumferenitially surrounding the thin insulating dielectric material 50 is a thin metal conductor 52, which may be grounded. Since the first conductive line 42 lies on top of the insulated substrate 44, the side of the first conductive line 42 facing the insulated substrate 44 will not be covered with the dielectric material 50 or the metal conductor 52. The coaxial portion of the structure 40 will enhance the functionality of the resulting IC employing the multi-layered interconnect structure 40. The multi-layered interconnect structure 40 is covered with a dielectric material 54 suitable for facilitating the mitigation of capacitive crosstalk between adjacent conductive lines of the structure 40.

As will be discussed in greater detail below, the present invention employs a robust first dielectric material (e.g., $SiO_2$, $Si_3N_4$) during initial formation of the multi-layered interconnect structure 40 of the IC, and after the base multi-layered interconnect structure 40 is substantially complete deposition steps are performed on the multi-layered interconnect structure 40 to form at least some coaxial interconnect lines and/or plugs using the dielectric material 50 (second dielectric material). Thereafter, the dielectric material 54 (third dielectric material—e.g., polyimides, Teflon, aerogels) having a dielectric constant suitable for mitigating capacitive crosstalk between adjacent conductive lines is deposited over the multi-layered interconnect structure 40. As noted above, newer dielectric materials having low dielectric constant such as Teflon are not amendable to being used during fabrication of the multi-layered interconnect structure because the newer dielectric materials are relatively weak and tend to crack during the fabrication steps. However, because the newer dielectric material is applied after the multi-layered interconnect structure 40 is substantially complete the newer dielectric material may be employed without being exposed to the harsh fabrication steps that cause cracking thereof.

Figure 3B:
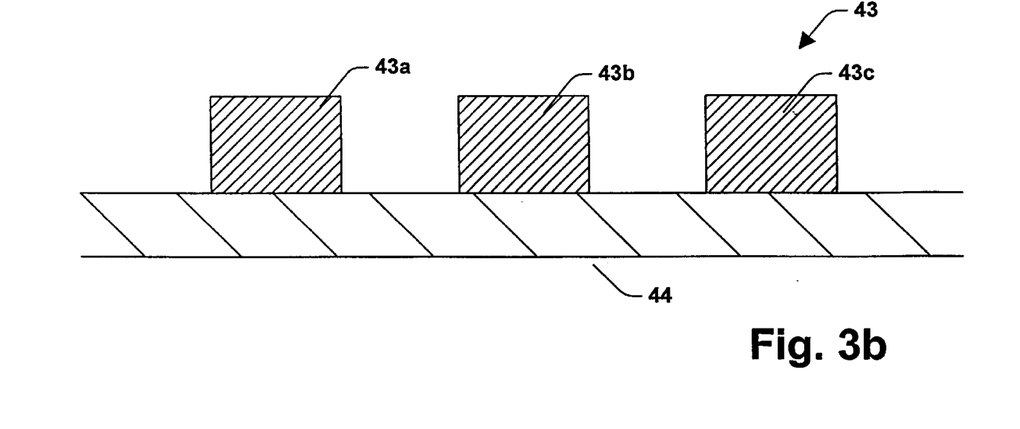
FIG. 3b is a schematic cross-sectional illustration of a first layer of conductive lines being formed on a semiconductor substrate in accordance with the present invention.

Referring now to FIG. 3b, an insulating layer is formed on the substrate 44 via a suitable deposition technique such as for example using chemical vapor deposition (CVD) or by a spinning technique. Both the insulating layer and substrate are illustrated in common for ease of understanding and are referenced by number 44. A conductive pattern 43 (e.g., including conductive lines 43a, 43b and 43c) is formed over the insulating/substrate layer 44. Preferably a metalization pattern is formed by depositing a metalization layer and patterning employing suitable photolithographic and etching techniques (e.g., anisotropic etching such as reactive ion etching). The conductive pattern 43 may be deposited by any of a variety of suitable deposition techniques, such as CVD processes including low pressure chemical vapor deposition (LPCVD) and plasma enhanced chemical vapor deposition (PECVD), melting or sputtering.

The conductive pattern 43 formed in the claimed invention may comprise any suitable conductive material employable for forming conductive patterns in the semiconductor industry. Preferably, the conductive material includes a member selected from the group consisting of refractory materials, such as titanium and titanium alloys, tungsten and tungsten alloys, aluminum and aluminum alloys, copper and copper alloys and polycrystalline silicon. The insulating material 44 employed in the present invention may comprise any suitable insulating material employable in the semiconductor industry for forming insulating layers. Preferably, the insulating material 44 comprises a member selected from the group consisting of nitrides, oxides, oxy-nitrides, polyimides and polymeric materials.

Figure 3C:
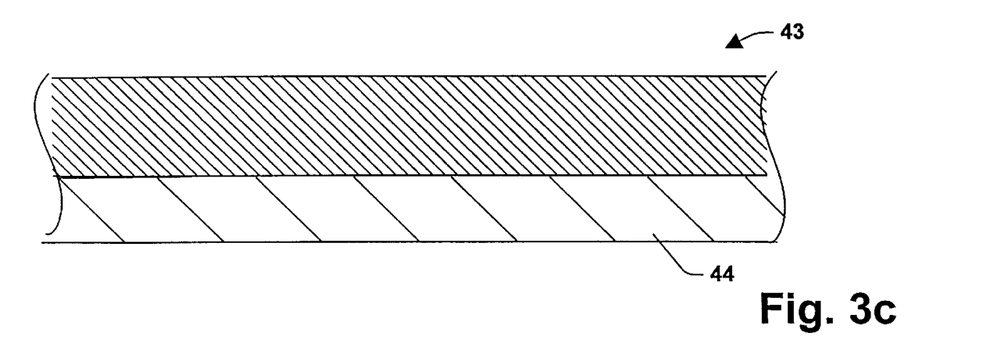
FIG. 3c is a schematic cross-sectional illustration of the first layer of conductive lines of FIG. 3b from a perpendicular view in accordance with the present invention.
Figure 4:
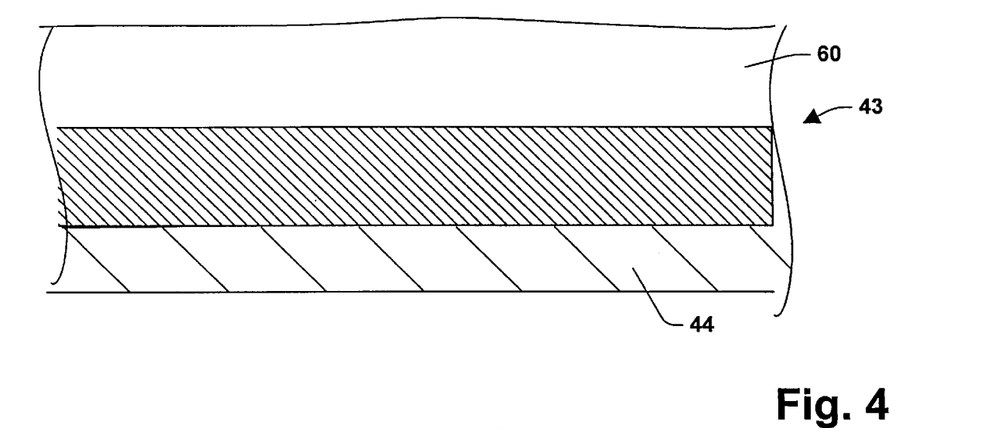
FIG. 4 is a schematic cross-sectional illustration of dielectric material being deposited over the conductive lines of FIG. 3 in accordance with the present invention.

Turning now to FIG. 3c, a schematic cross section illustration is shown of a first layer (e.g., pattern) of the conductive lines 43 of FIG. 3b from a view perpendicular to the direction the conductive lines 43a, 43b and 43c are running. FIG. 4 is a schematic cross-sectional view of a first dielectric material 60 (e.g., SiO$_2$, Si$_3$N$_4$) being deposited over the conductive lines 43. The first dielectric material 60 in the exemplary embodiment is preferably silicon dioxide (SiO$_2$), however, it will be appreciated that any suitable dielectric material may be employed to carry out the present invention and falls within the scope of the claims.

Any suitable technique for depositing the dielectric material 60 may be employed such as PECVD, or high density plasma chemical vapor deposition (HDPCVD) techniques such as electron cyclotron resonance (ECR), inductor coupled plasma (ICP), transformer coupled plasma (TCP) and helicon plasma. The dielectric material 60 is deposited over the conductive pattern 43 so as to form a seal of dielectric material over the conductive lines 43a, 43b and 43c and the spaces between the conductive lines 43a, 43b and 43c.

Figure 5:
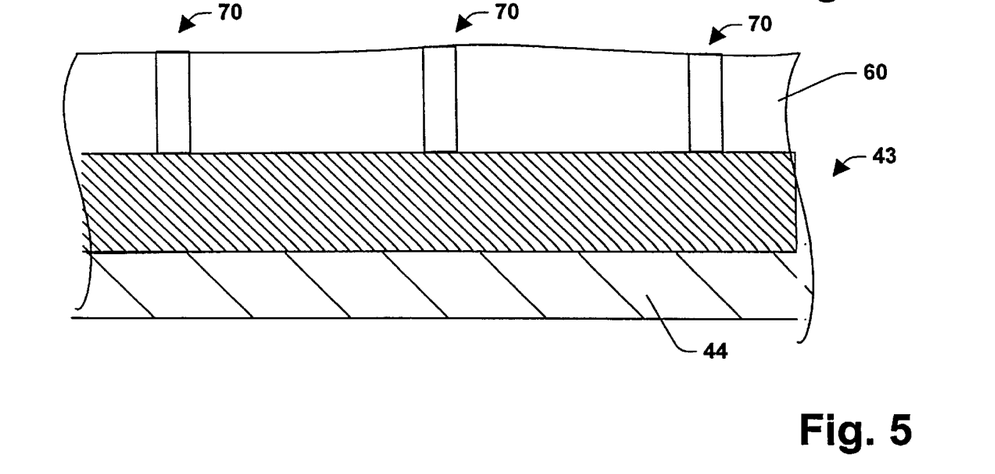
FIG. 5 is a schematic cross-sectional illustration of vias being formed in the dielectric material of FIG. 3 in accordance with the present invention.
Figure 6:
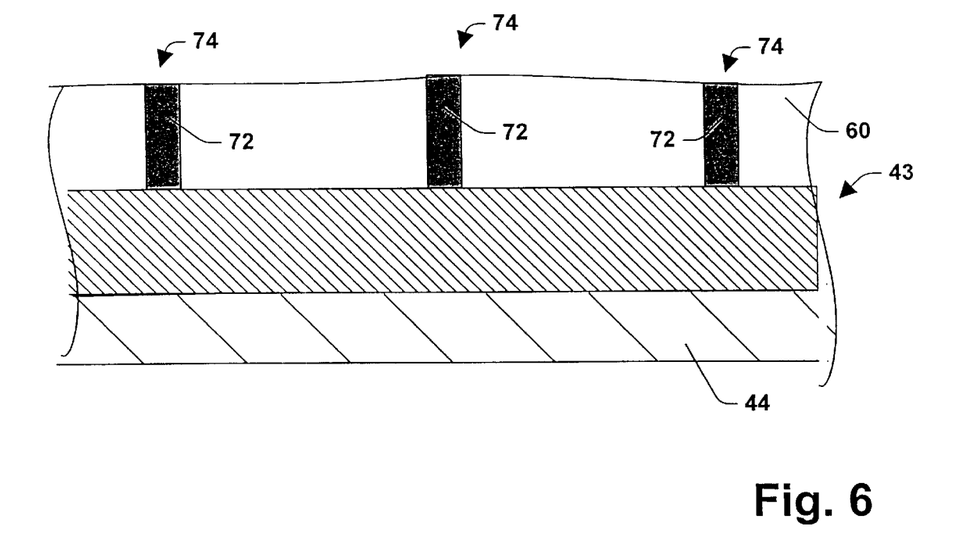
FIG. 6 is a schematic cross-sectional illustration of the vias of FIG. 5 being filled to form plugs in accordance with the present invention.

Turning now to FIGS. 5 and 6, vias 70 are formed within the dielectric material 60 and the vias 70 are filled with a suitable material (e.g., tungsten, copper) to form plugs which provide conductive pathways through the dielectric layer 60 to connect interconnects of different conductor layers. Although, the present invention is described with respect to forming only two conductive layers for ease of understanding, it is to be appreciated that many more conductive layers separated with the dielectric material 60 may be formed, and such structures are intended to fall within the scope of the hereto appended claims. While different conductive materials are suitable to fill the vias 70, in this example tungsten forms conductive material 72. The tungsten filled vias 70 are referred to as tungsten plugs 74. Copper, aluminum or an aluminum alloy are exemplary of other plug conductors. The plugs 74 may comprise any other suitable conductive material, which is chemical-vapor deposited with a flow rate sufficient to fill the vias 70 so as to have an aspect ratio less than, for example, 4:1. The plug material 72 is removed from the upper surfaces of dielectric 60 using, for example, sacrificial etchback or CMP.

In an alternative embodiment, the conductive pattern 43 and/or plugs 74 may include copper (Cu). Since Cu easily diffuses into dielectric materials such as SiO$_2$, a damascene process may be employed to create a barrier layer (e.g., Ta$_2$N) between the Cu and the dielectric so as to mitigate diffusion of the Cu into the dielectric 60. Damascene techniques are known in the art, and therefore further discussion related thereto is omitted for sake of brevity. It is to be appreciated that the damascene technique may be performed to generate a barrier layer between any other suitable metal (e.g., tungsten) employed in the formation of the conductive pattern 43 and/or plugs 74.

Figure 7:
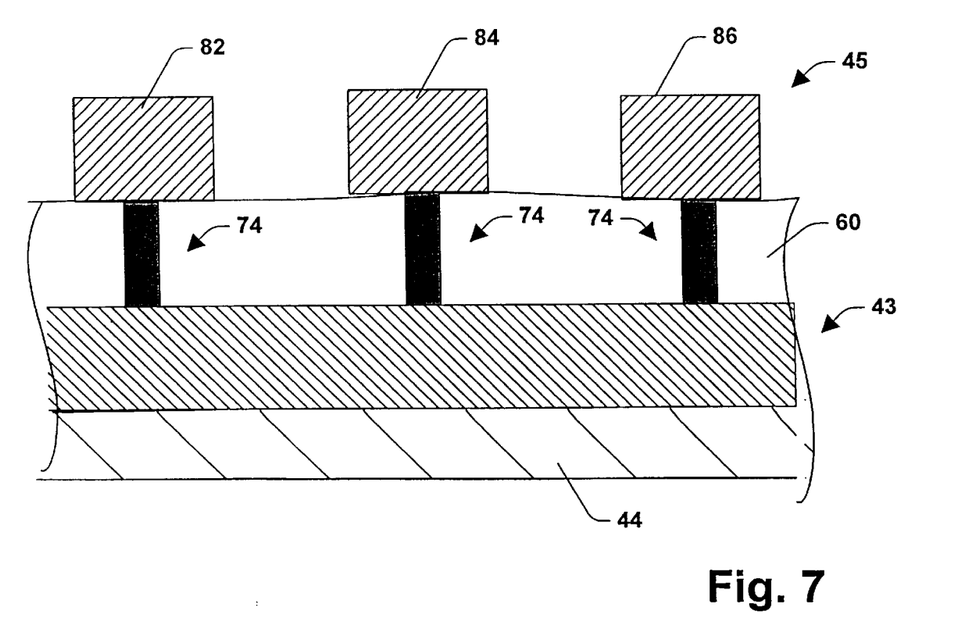
FIG. 7 is a schematic cross-sectional illustration of a second layer of conductive lines being formed over the plugs and dielectric layer of FIG. 6 in accordance with the present invention.

FIG. 7 illustrates the second conductive layer 45 (including conductive lines 82, 84 and 86) being formed over the dielectric material 60 and the plugs 74. Thus, the plugs 74 provide for electrically connecting respective lines of the second conductive layer 45 to respective lines of the first conductive layer 43. The second conductive layer 45 is formed in a manner substantially similar to the manner of forming the first conductive layer 43, and therefore further discussion related thereto is omitted for sake of brevity. The first conductive layer 43, the plugs 74 and the second conductive layer 45 collectively form the multi-layered interconnect structure 40. Of course, the multi-layered interconnect structure 40 may include additional conductive layers and layers of plugs.

Figure 8:
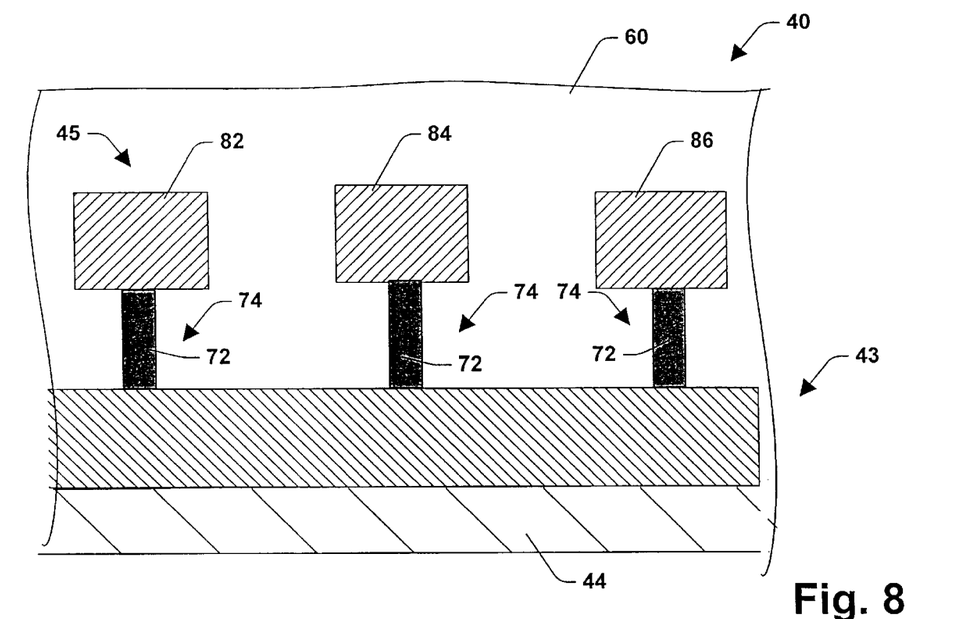
FIG. 8 is a schematic cross-sectional illustration of dielectric material being formed over the second layer of conductive lines of FIG. 7 in accordance with the present invention.

FIG. 8 is a cross-sectional illustration of the multi-layered interconnect structure 40 after additional first dielectric material 60 is deposited thereon to cover the second conductive layer 45 and fill spaces 92 between lines of the second conductive layer 45.

Figure 9:
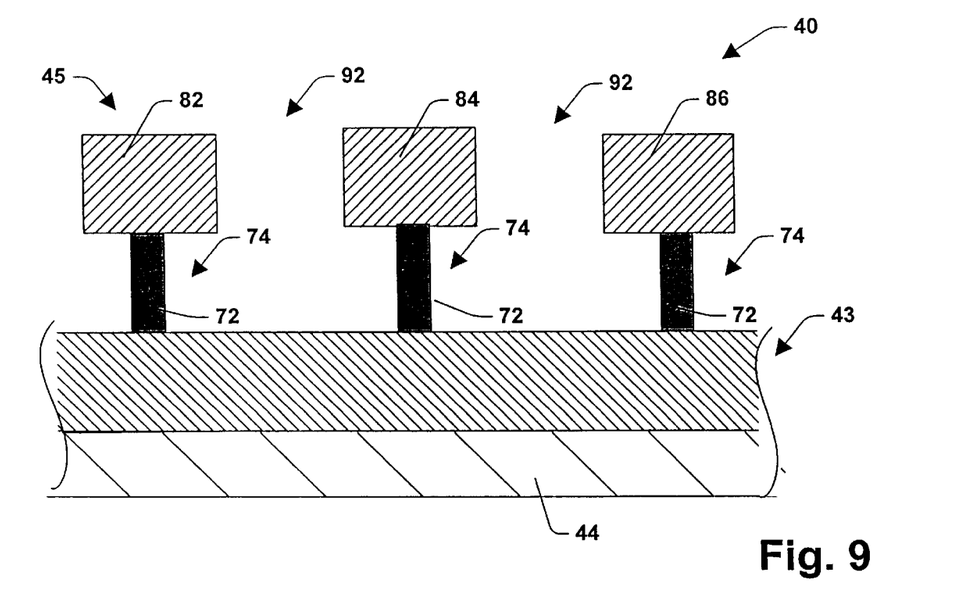
FIG. 9 is a schematic cross-sectional illustration of the interconnect structure of FIG. 7 after the dielectric material has been stripped away in accordance with the present invention.
Figure 10:
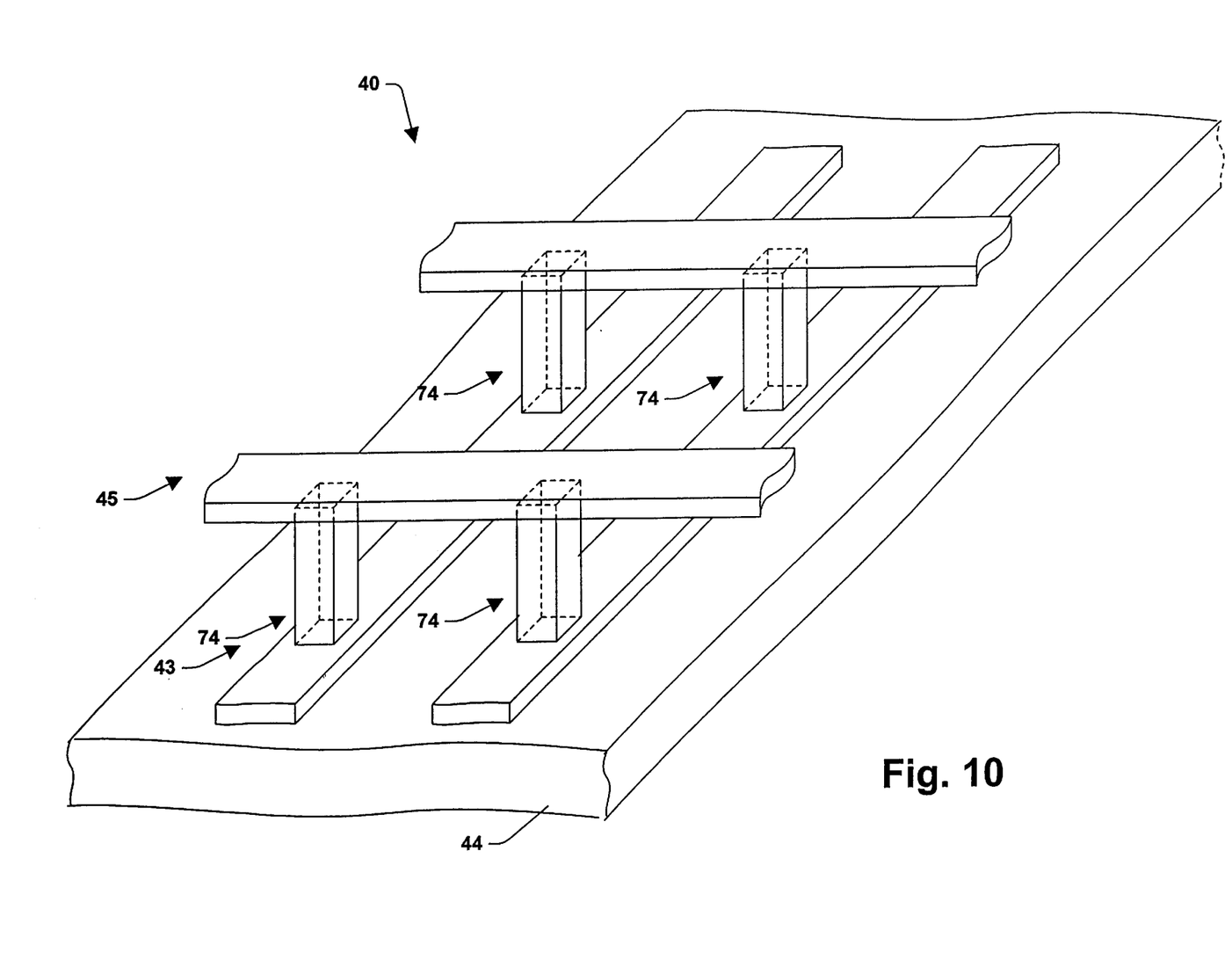
FIG. 10 is a schematic partial perspective illustration of the interconnect structure of FIG. 9 in accordance with the present invention.

Turning now to FIG. 9, the first dielectric material 60 is shown stripped away to leave the multi-layered interconnect structure 40 exposed to air. In the preferred embodiment, hydrofluoric acid (HF) is employed to strip the first dielectric 60 via an HF dip, however any suitable technique (e.g., wet etch) for stripping the first dielectric material may be employed. The HF dip affords for stripping the first dielectric material 60 (e.g., SiO$_2$) without stripping the barrier layer (not shown) that may be coating the conductive patterns 43 and 45 and/or plugs 74. Although air is an ideal insulator (K≈1), the multi-layered interconnect structure 40 is substantially weak and maintaining integrity thereof without supportive materials would be difficult. Thus, as will be discussed in greater detail below, after the base interconnect structure 40 is complete the third dielectric material 54 (see FIG. 14) is deposited over the interconnect structure to replace the stripped away first dielectric material 60. The third dielectric material 54 provides support to the interconnect structure 40 and facilitates mitigating capacitive crosstalk between adjacent conductive lines of the interconnect structure 40. FIG. 10 is a schematic partial perspective view of the multi-layered interconnect structure 40 shown in FIG. 9.

Figure 11:
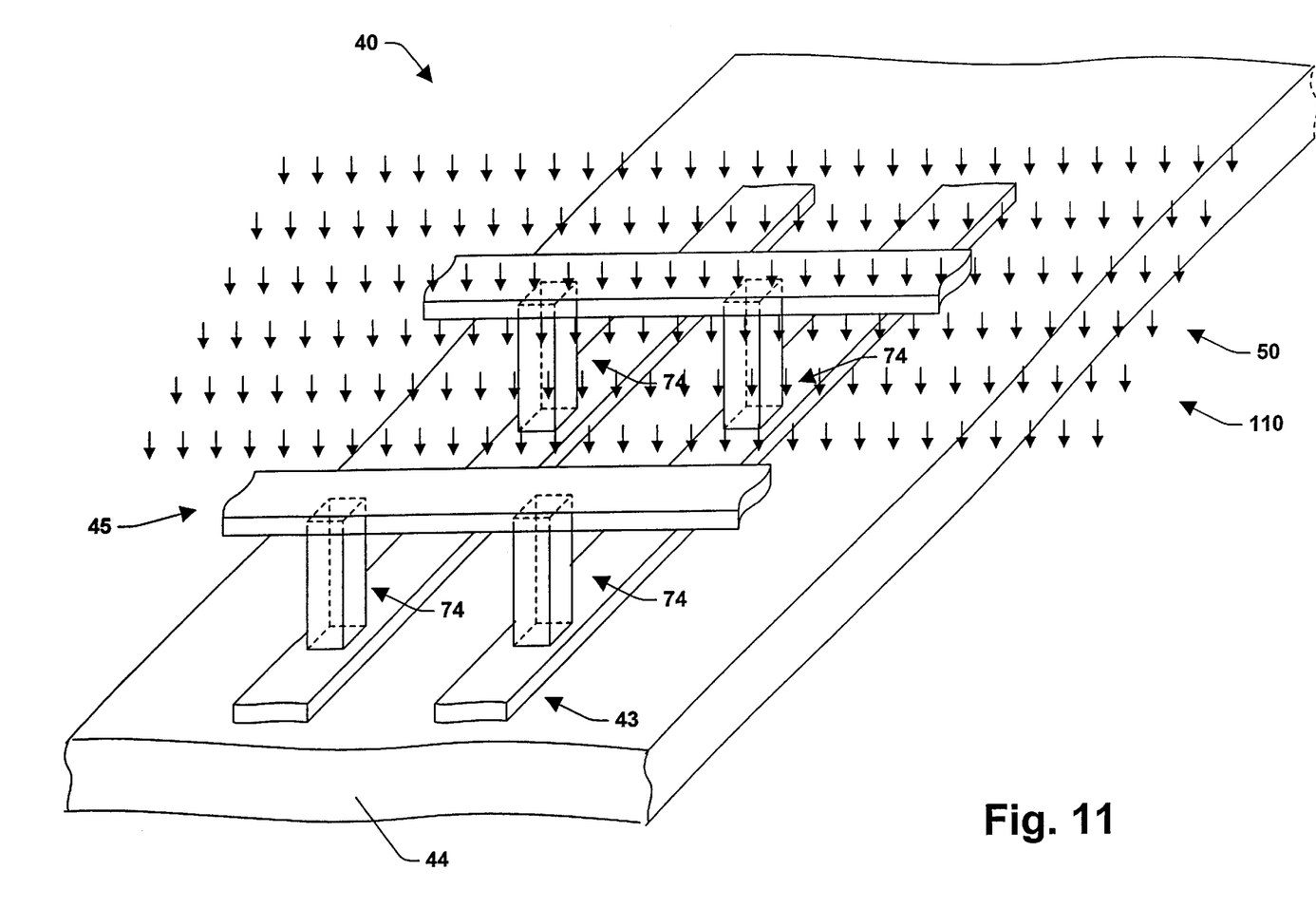
FIG. 11 is a schematic perspective illustration of the interconnect structure of FIG. 10 undergoing a first atomic layer deposition step in accordance with the present invention.
Figure 12:
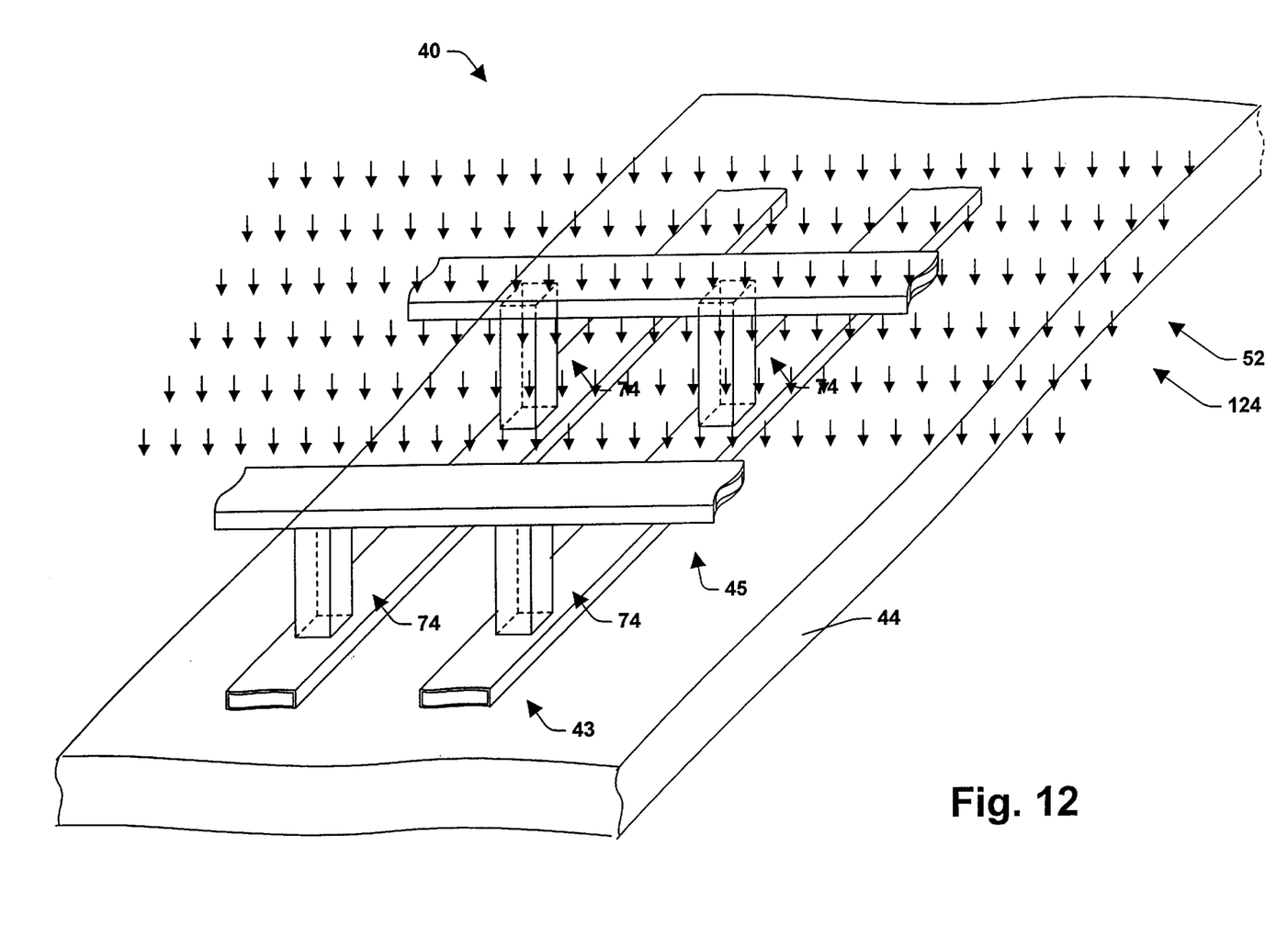
FIG. 12 is a schematic perspective illustration of the interconnect structure of FIG. 11 undergoing a second atomic layer deposition step in accordance with the present invention.

FIG. 11 is a schematic illustration of the multi-layered interconnect structure 40 undergoing a first atomic layer deposition (ALD) step 110 wherein the thin layer of second dielectric material 50 (e.g., SiO$_2$, silicon nitrides (Si$_x$N$_z$), Si$_x$O$_y$N$_z$—where "x", "y" and "z" are integers) is formed on at least a portion of the multi-layered interconnect structure 40. This thin layer of second dielectric material 50 will be an insulating material which is interposed between a central conductor and an outer conductor of a coaxial interconnect in accordance with the present invention. FIG. 12 illustrates the multi-layered interconnect structure 40 undergoing a second ALD step 124 wherein the thin layer of metal 52 (e.g., Ta$_2$N) is formed over the portions of the multi-layered interconnect structure 40 selected to be coated with the second dielectric material 50 applied in the first ALD step 110. The thin layer of metal 52 will be the outer conductor of the coaxial interconnect. Thus, the first and second ALD steps provide for forming coaxial interconnects (e.g., conductive lines or plugs which are coaxial in nature).

Although, atomic layer deposition is a preferred technique for depositing the thin dielectric material layer and thin metal layer, it is to be appreciated that other techniques (e.g., vacuum evaporation, chemical vapor deposition, electrochemical deposition) may be employed. Any suitable deposition technique or other means for carrying out the present invention may be employed and is intended to fall within the scope of the present claims. ALD and the other aforementioned techniques are well known in the art, and thus based on the description herein one skilled in the art could readily carry out suitable deposition techniques to generate the coaxial portions of the present invention.

Figure 13:
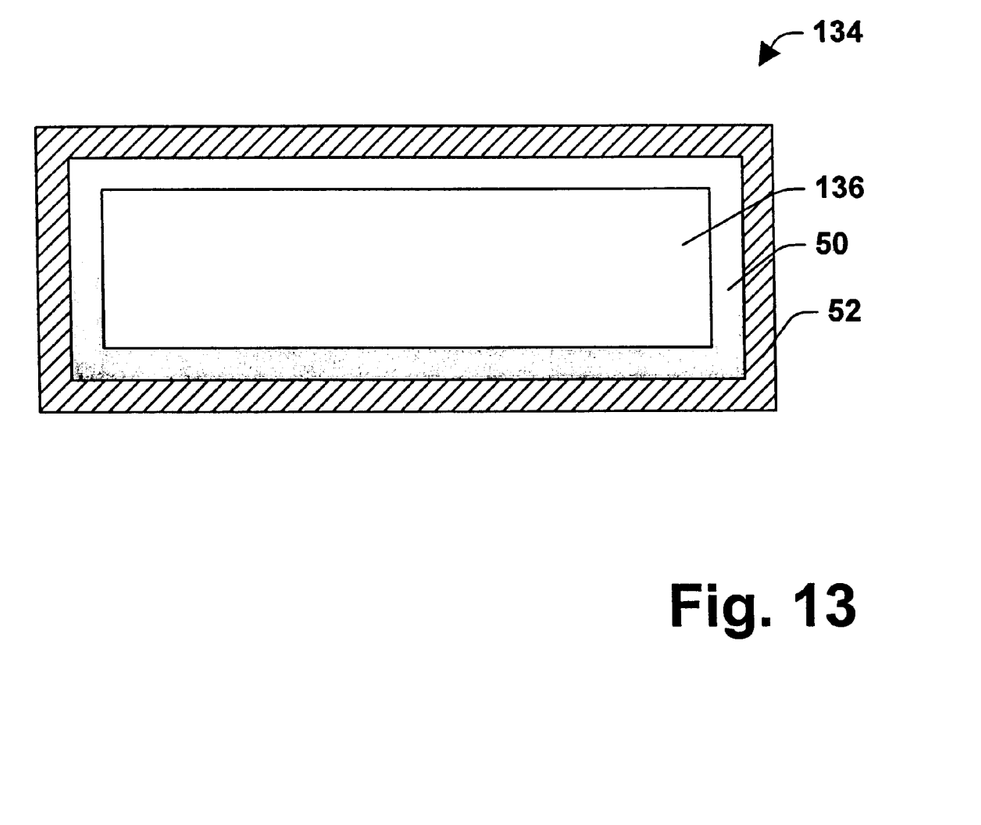
FIG. 13 is a schematic cross-sectional illustration of a coaxial interconnect line in accordance with the present invention.

Referring now to FIG. 13, a schematic cross-sectional illustration of a coaxial interconnect 134 is shown. The coaxial interconnect includes a central conductor 136, the outer metal conductive material 52 and the dielectric material 50 interposed between the central conductor 136 and the outer conductive material 52. The coaxial interconnect 134 provides for the signal carrying central conductor 136 to be circumferentially surrounded by the outer metal conductor 52 which may be grounded and the insulating dielectric material 50 interposed there between. The central conductor 136 is thus substantially shielded from passing noise and induced electromagnetic fields resulting from changing signals therein, as well as the central conductor 136 being substantially shielded from externally generated noise and electromagnetic fields.

Figure 14:
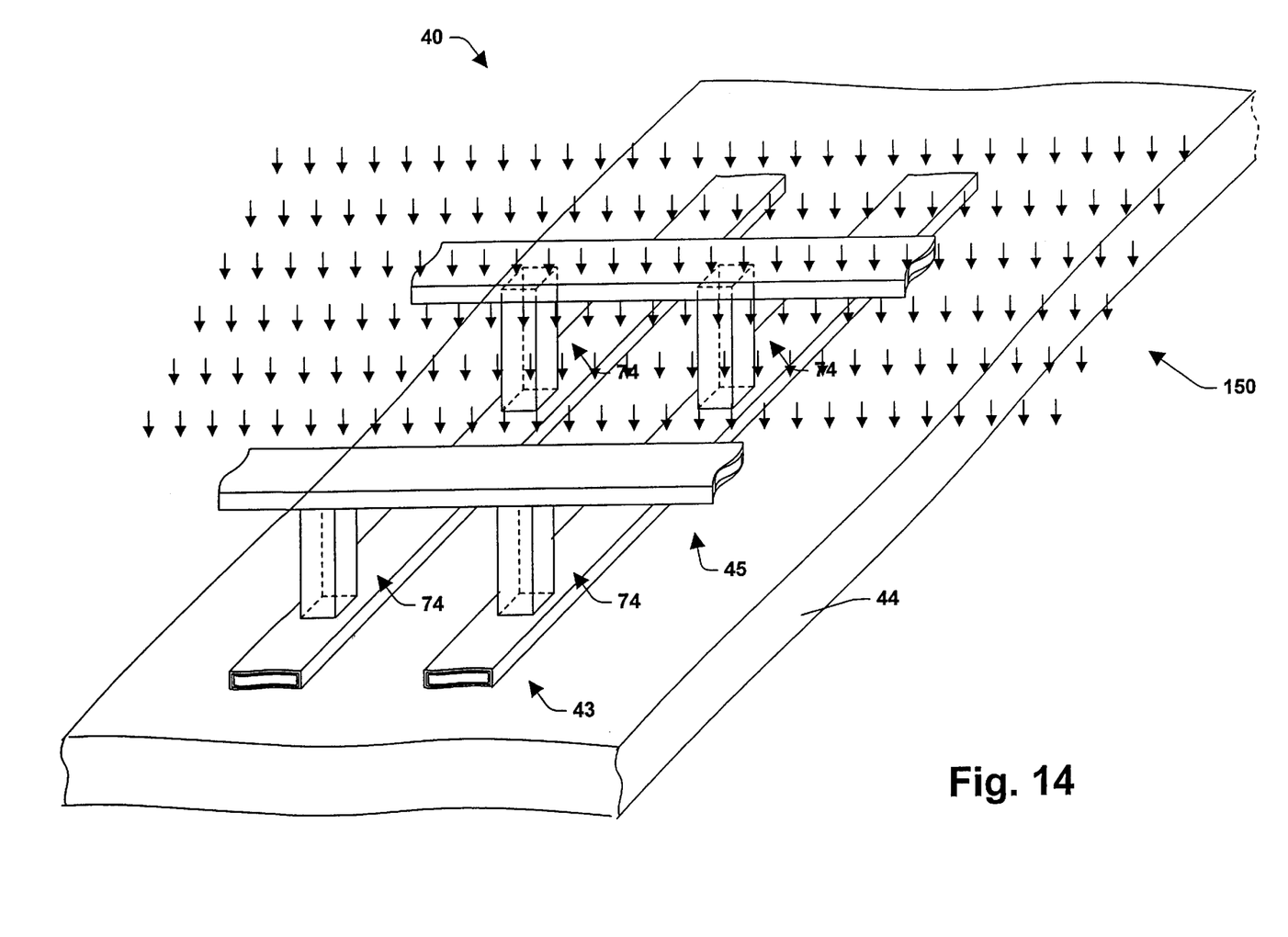
FIG. 14 is a schematic perspective illustration of the interconnect structure of FIG. 12 having a dielectric material of suitably low dielectric constant being deposited thereon.

Turning now to FIG. 14, the interconnect structure 40 is shown substantially complete, however, the interconnect structure 40 is exposed to air. Thus, the interconnect structure 40 is in a from which may not be structurally sound enough to withstand prolonged exposure to vibrations, movement, etc. Therefore, a step 150 of depositing the third dielectric material 54 over the interconnect structure 40 is performed. The third dielectric material 54 is selected to have a dielectric constant suitable to facilitate mitigating capacitive crosstalk between conductive lines of the interconnect structure 40. Accordingly, the third dielectric material 54 preferably has a dielectric constant less than 3.0. Any suitable material (e.g., polyinides, Teflon, aerogels) may be employed as the third dielectric material 54 and is intended to fall within the scope of the hereto appended claims.

The third dielectric material 54 is deposited over the interconnect structure 40 to replace the stripped away first dielectric material 60. Any suitable technique for depositing the third dielectric material 54 may be employed. For example, any of the following deposition techniques may be employed: PECVD, or high density plasma chemical vapor deposition (HDPCVD) techniques such as electron cyclotron resonance (ECR), inductor coupled plasma (ICP), transformer coupled plasma (TCP) and helicon plasma. The third dielectric material 54 is deposited over the interconnect structure 40 so as to form a seal of dielectric material over conductive lines of the various conductive patterns and fill spaces between the conductive lines and the conductive patterns. Thus, the third dielectric material 54 provides for structurally supporting the interconnect structure 40 and also provides for facilitating the mitigation of capacitive crosstalk between adjacent conductive lines of the interconnect structure 40.

Figure 15:
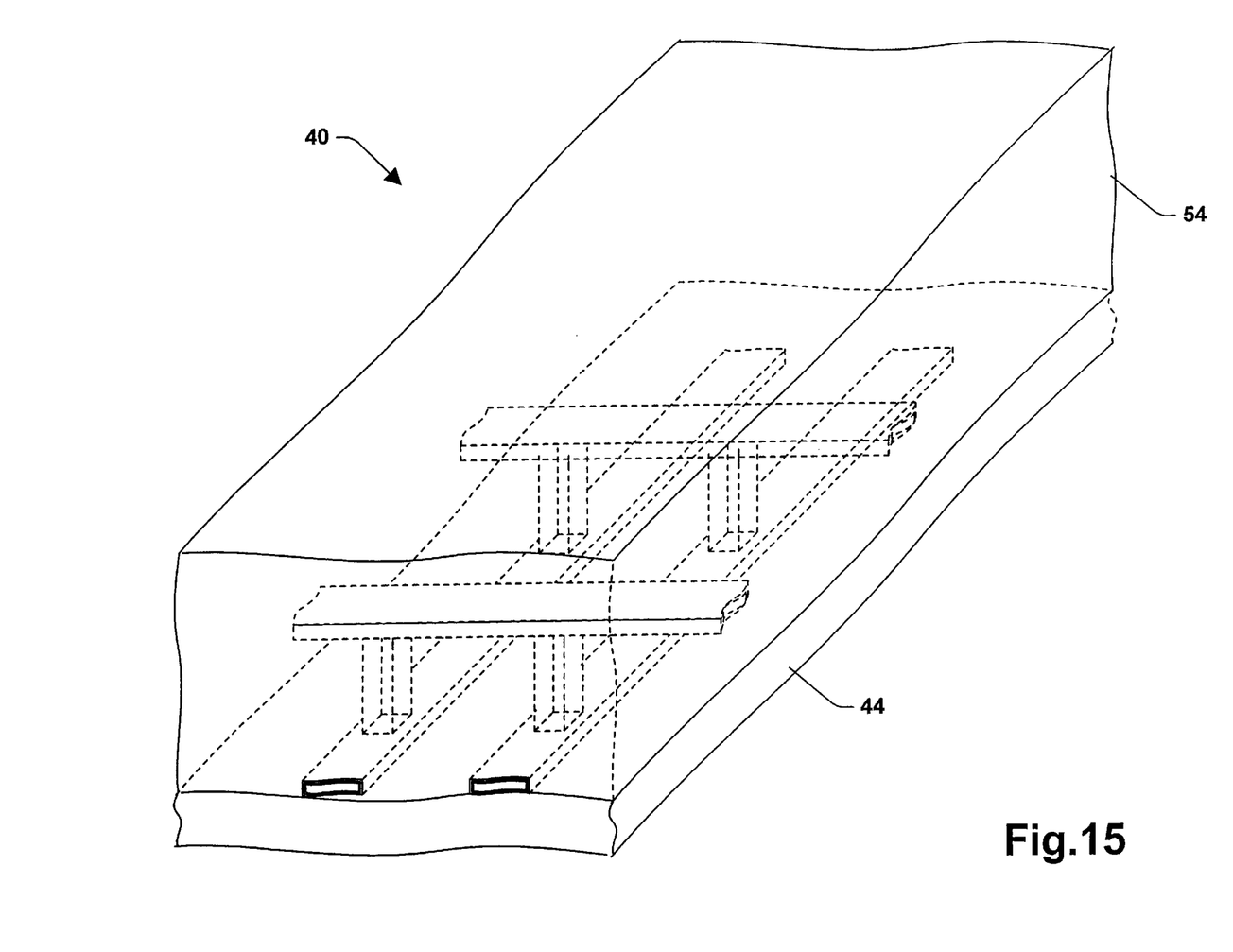
FIG. 15 is a schematic perspective illustration of the interconnect structure of FIG. 14 after the dielectric material having suitably low dielectric constant has been deposited over the interconnect structure in accordance with the present invention.

FIG. 15 is a schematic partial perspective illustration of the interconnect structure 40 complete in relevant part.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A semiconductor device comprising:
   a substrate;
   an insulating layer formed on the substrate; and
   an interconnect structure including:
      a first conductive pattern formed on the insulating layer, the conductive pattern including at least two conductive lines adjacent one another;
      a first dielectric material selected from at least one of: polyimides, Teflon, and aerogels and formed over the conductive pattern, the first dielectric material filling a space between the at least two conductive lines;
      at least one plug formed in the first dielectric material;
      a second conductive pattern formed over the first dielectric material and the at least one plug;
      wherein at least a portion of the first and the second conductive patterns associated with the interconnect structure is coaxial in nature; and
      a second dielectric material formed over the interconnect structure, the second dielectric material having a dielectric constant less than about 3.0.

2. The semiconductor device of claim 1, wherein the at least coaxial portion of the interconnect structure includes a central conductor, an outer conductor and an insulating material interposed between the central conductor and outer conductor.

3. The semiconductor device of claim 2, the insulating material circumferentially surrounding the central conductor.

4. The semiconductor device of claim 2, the outer conductor circumferentially surrounding the insulating material.

5. The semiconductor device of claim 1, the first dielectric material having a dielectric constant less than about 2.5.

6. The semiconductor device of claim 1, the first dielectric material having a dielectric constant less than about 2.0.

7. The semiconductor device of claim 1, the second dielectric material including at least one of $SiO_2$, $Si_3N_4$, and silicon oxynitride.

8. The semiconductor device of claim 1, the outer metal conductor including tantalum nitride.

9. A semiconductor device comprising:
   a substrate;
   an insulating layer formed on the substrate;
   a first conductor line formed on at least a portion of the insulating layer and having a top surface facing away from the insulating layer;
   a conductive plug having a lower end connected with a first portion of the top surface of the first conductor line, an upper end facing away from the first conductor line, and at least one side between the upper and lower ends;
   a second conductor line spaced from the first conductor line and having a bottom surface, a top surface and a side surface, a first portion of the bottom surface of the second conductor line being connected to the upper end of the plug;
   an insulator coating formed on a second portion of the top surface of the first conductor line, the at least one side of the plug, and the remainder surface of the second conductor line;
   a conductive coating formed on the insulator coating, wherein at least a portion of the conductive coating circumferentially surrounds at least a portion of the second conductor line; and
   a dielectric material selected from at least one of: polyimides, Teflon, and aerogels and formed on the conductive coating, wherein the dielectric material has a dielectric constant less, than about 3.0.

10. The semiconductor device of claim 9, wherein the insulator coating is formed on at least a second portion of the bottom surface of the second conductor line.

11. The semiconductor device of claim 10, further comprising a dielectric material formed on the conductive coating.

12. The semiconductor device of claim 11, wherein the conductive coating and the second conductor line are generally coaxial.

13. The semiconductor device of claim 9, wherein the conductive coating and the second conductor line are generally coaxial.

14. The semiconductor device of claim 9, wherein the insulator coating comprises a dielectric material.

15. A semiconductor device comprising:

a substrate;

a first conductor line having a top surface facing away from the substrate;

a conductive plug having a lower end connected with a first portion of the top surface of the first conductor line, an upper end facing away from the first conductor line, and at least one side between the upper and lower ends;

a second conductor line spaced from the first conductor line and having a bottom surface thereof connected to the upper end of the plug, and a top surface and a side surface;

an insulator coating formed on a second portion of the top surface of the first conductor line, the at least one side of the plug, and the remainder surface of the second conductor line;

a conductive coating formed on the insulator coating, wherein at least a portion of the conductive coating circumferentially surrounds at least a portion of the second conductor line; and a dielectric material selected from at least one of: polyimides, Teflon, and aerogels and formed on the conductive coating, wherein the dielectric material has a dielectric constant less than about 3.0.

* * * * *

UNITED STATES PATENT AND TRADEMARK OFFICE
CERTIFICATE OF CORRECTION

PATENT NO. : 6,281,587 B1
DATED : August 28, 2001
INVENTOR(S) : Takeshi Nogami et al.

It is certified that error appears in the above-identified patent and that said Letters Patent is hereby corrected as shown below:

Column 5,
Line 51, please replace "stricture" with -- structure --.

Column 9,
Line 8, please replace "from" with -- form --.

Signed and Sealed this

Twenty-sixth Day of February, 2002

Attest:

JAMES E. ROGAN
Attesting Officer   Director of the United States Patent and Trademark Office